(12) United States Patent
Hirai

(10) Patent No.: US 7,394,319 B2
(45) Date of Patent: Jul. 1, 2008

(54) PULSE WIDTH MODULATION CIRCUIT AND MULTIPHASE CLOCK GENERATION CIRCUIT

(75) Inventor: Yoshitaka Hirai, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 106 days.

(21) Appl. No.: 11/411,754

(22) Filed: Apr. 27, 2006

(65) Prior Publication Data

US 2006/0255866 A1    Nov. 16, 2006

(30) Foreign Application Priority Data

May 10, 2005    (JP)    ............................... 2005-137041

(51) Int. Cl.
 *H03K 7/08*    (2006.01)
 *H03L 7/08*    (2006.01)
(52) U.S. Cl. ........................... 331/1 A; 331/16; 331/45; 332/109
(58) Field of Classification Search ................. 331/1 A, 331/16–18, 25, 45, 57; 332/109–111
See application file for complete search history.

(56) References Cited

U.S. PATENT DOCUMENTS

| | | | |
|---|---|---|---|
| 6,888,412 B2 * | 5/2005 | Kim et al. | .................... 331/1 A |
| 2004/0257124 A1 | 12/2004 | Araki et al. | |
| 2006/0001467 A1 | 1/2006 | Fujino et al. | |

FOREIGN PATENT DOCUMENTS

| | | |
|---|---|---|
| JP | 56-69929 | 6/1981 |
| JP | 6-177723 | 6/1994 |
| JP | 2001-339280 | 12/2001 |
| JP | 3512676 | 1/2004 |

* cited by examiner

*Primary Examiner*—David Mis
(74) *Attorney, Agent, or Firm*—McGinn IP Law Group, PLLC

(57) ABSTRACT

A pulse width modulation circuit comprises a multiphase clock generation section which generates multiphase clock signals based on a reference clock, and a pulse width modulation signal generation section which generates pulse width modulation signals based on input data and on multiphase clock signals generated by the multiphase clock generation section. The multiphase clock generation section has a phase-locked loop circuit and a clock selection circuit which selects an arbitrary clock signal from among the multiphase clock signals and outputs the selected clock signal to the phase-locked loop circuit as a feedback clock.

17 Claims, 16 Drawing Sheets

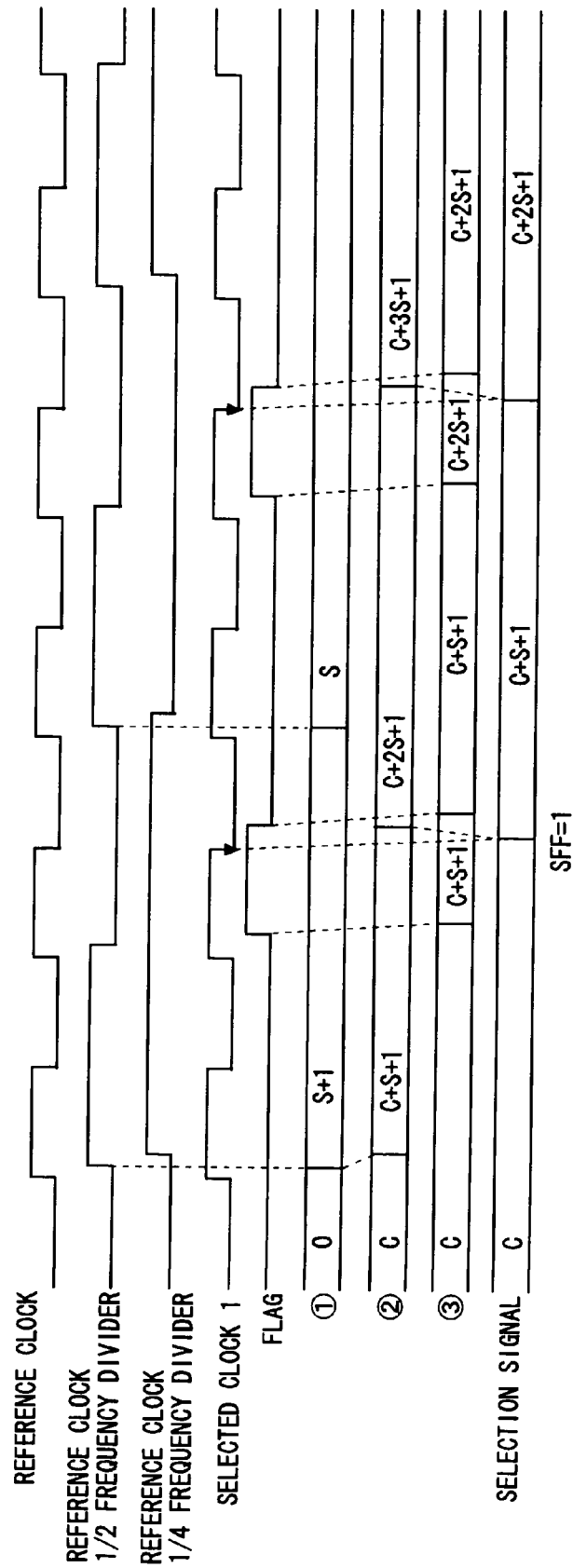

PULSE WIDTH MODULATION CIRCUIT AND MULTIPHASE CLOCK GENERATION CIRCUIT

BACKGROUND OF THE INVENTION

1. Field of the Invention

This invention relates to a pulse width modulation circuit which performs modulation of pulse widths based on input data. This invention also relates to a multiphase clock generation circuit which can be used in this pulse width modulation circuit.

2. Description of Related Art

In recent years, laser beam printers (LBPs) and digital copy equipment equipped with lasers have been widely adopted, due to their high resolution and their quiet and fast operation. The pulse width modulation (PWM) method is primarily used for control of printing grayscales in such equipment. Pulse width modulation method is a method in which the grayscale (that is, the density) of each printed dot is controlled through a pulse width.

Conventional pulse width modulation circuitry can be broadly divided into two types, which are counter types and delay types. A counter-type circuit is for example disclosed in Japanese Unexamined Patent Application Publication No. 56-69929. In this counter-type circuit, a reference clock is counted by a counter circuit, and the count value and a digital pulse data value, that is, input data, are compared by a comparator; when the result of comparison indicates coincidence, the pulse width modulation output, that is, the PWM output, is changed.

The delay method is for example disclosed in Japanese Unexamined Patent Application Publication No. 6-177723. In this delay method, a reference clock is input to a delay circuit, and from the plurality of delay signals output from the delay circuit, that signal corresponding to a digital pulse data value is selected, and the PWM output is changed.

However, there is the problem that in the cases of the counter method and delay method used in conventional pulse width modulation circuits, it is difficult to achieve fast and precise operation, and these methods are not suitable for lowering costs.

For example, consider a case in which PWM pulses are to be generated at 100 MHz with 8-bit resolution. In this case, time-conversion of the resolution yields $1 s/100 MHz/2^8 = 40$ ps. In the counter method, this means that a counter circuit is necessary which operates with a clock period tCK=40 ps or less. In the delay method, this means that the delay time per cell stage in the delay circuit must be 40 ps or less. It is difficult to realize such performance using current CMOS technology.

On the other hand, by performing interleaving processing, the 40 ps constraint can be relaxed; but in this case the number of interleave divisions is large (16 to 32), so that such new problems as increased circuit scale and scattering among the phases of each stage arise.

Hence in order to resolve the above problems, in Japanese Patent Application No. 2004-196354, which is correspond to U.S. Patent Publication No. US-2006-0001467-A1, the applicant proposed a pulse width modulation circuit which utilizes multiphase clock signals. This pulse width modulation circuit is explained briefly below.

FIG. 14 is a block diagram showing an entire pulse width modulation circuit of the previous application. This pulse width modulation circuit comprises a multiphase clock generation circuit 2, synchronization position detection circuit 3, digital pulse data signal processing circuit 4, multiphase clock (CLK) selection circuit 5, and pulse width modulation signal generation circuit 6.

A reference clock signal is input to the multiphase clock generation circuit 2 from the input terminal 1. This multiphase clock generation circuit 2 generates multiphase clock signals based on the input reference clock, and outputs the signals to a synchronization position detection circuit 3 and multiphase clock selection circuit 5. The multiphase clock generation circuit 2 generates multiphase clock signals by phase interpolation of intermediate clock signals generated by a phase-locked loop circuit. The multiphase clock signals include clock signals with 256 ($=2^8$) phases in the case of 8-bit resolution.

The multiphase clock signals output from the multiphase clock generation circuit 2 and a horizontal sync signal which is a reference signal are input to the synchronization position detection circuit 3. The synchronization position detection circuit 3 detects the clock signal among the multiphase clock signals with which the horizontal sync signal is synchronized. A synchronization position detection signal indicating the result of synchronization position detection is output to the digital pulse data signal processing circuit 4 and to the multiphase clock selection circuit 5.

The digital pulse data which is the input data, and the synchronization position detection signal output from the synchronization position detection circuit 3, are input to the digital pulse data signal processing circuit 4. The digital pulse data signal processing circuit 4 converts the input digital pulse data into PWM pulse rising-edge and falling-edge information according to the synchronization position detection result, in order to synchronize the PWM pulses with the horizontal sync signal. Signals containing rising-edge and falling-edge information are output to the multiphase clock selection circuit 5.

The multiphase clock signals output from the multiphase clock generation circuit 2, the synchronization position detection signals output from the synchronization position detection circuit 3, and the signals containing rising-edge and falling-edge information output from the digital pulse data signal processing circuit 4, are input to the multiphase clock selection circuit 5. The multiphase clock selection circuit 5 selects arbitrary clock signals from among the multiphase clock signals, according to the rising-edge and falling-edge information. The selected clock, that is, the selection clock signal, is output to the pulse width modulation signal generation circuit 6.

The selection clock signal is input by the multiphase clock selection circuit 5 to the pulse width modulation signal generation circuit 6. The pulse width modulation signal generation circuit 6 generates pulse width modulation signals (PWM pulses) based on selection clock signals. These pulse width modulation signals are for example signals used to modulate laser output.

FIG. 15 shows an example of the specific circuit configuration of a multiphase clock generation circuit 2. In the multiphase clock generation circuit 2, a combination of a phase-locked loop (PLL) circuit and a phase interpolation circuit is used as the circuit which generates multiphase clock signals. In the previous application, when the oscillator of a PLL circuit alone is used to generate clock signals with 256 phases, it is difficult to achieve fast operation; and when a phase interpolation circuit alone is used to generate clock signals with 256 phases, there is an increase in error, and precision is degraded due to scattering in manufacturing processes. Hence a configuration was adopted in which both are used.

As shown in FIG. 15, the multiphase clock generation circuit 2 comprises a phase comparator 201, charge pump circuit 202, filter 203, VCO (Voltage Controlled Oscillator) circuit 204, phase interpolation circuit 205, output buffer 206, and delay circuit 207.

The phase comparator 201 receives as input the reference clock, performs processing for phase comparison of the rising waveform of the reference clock with the rising waveform of a feedback clock input via the delay circuit 207, and generates pulse information for the phase difference. The charge pump circuit 202 converts the phase different pulse information generated by the phase comparator 201 into current information.

The signal output from the charge pump circuit 202 is filtered by the filter 203 and output to the VCO circuit 204. The oscillation frequency of the VCO circuit 204 changes according to the input signal, to generate an intermediate clock signal. In this example, intermediate clock signals with 32 phases are generated. The VCO circuit 204 consists of a ring oscillator, in which 32 stages of differential amplifiers are connected in series, and the output of the final stage is inverted and input to the first stage. The outputs of each of the 32 stages of series-connected differential amplifiers become the intermediate clock signals with 32 phases. As the VCO circuit 204, the ring oscillator of Japanese Patent No. 3512676 can also be used.

The intermediate clock signals generated in the VCO circuit 204 are input to the phase interpolation circuit 205. The phase interpolation circuit 205 further increases the phases of the intermediate clock signals, to generate multiphase clock signals. In this example, the number of phases is increased in order from 32-phase intermediate clock signals to 64-phase clock signals, from 64-phase clock signals to 128-phase clock signals, and from 128-phase clock signals to 256-phase clock signals CLKIP[0] to CLKIP[255]. As the phase interpolation circuit 205, the timing difference division circuit described in Japanese Unexamined Patent Application Publication No. 2001-339280 can also be used.

Multiphase clock signals with the number of phases increased to 256 are output via the output buffer 206. Of these multiphase clock signals, the CLKIP[0] signal is fed back, is delayed a prescribed amount by the delay circuit 207, and is then input to the phase comparator 201.

By means of the above-described pulse width modulation circuit of the previous application, pulse width modulation can be performed rapidly and with high precision, and printing grayscales and other factors can be controlled appropriately when applied to laser beam printers. However, when used in laser beam printers employing a plurality of drums or in other cases, there may be causes in which fine adjustment of pulse frequencies is necessary in order to correct for scattering between drums.

In such a case, it is conceivable that by providing a variable frequency divider between the reference clock and the phase comparator 201, and between the delay circuit 207 and the phase comparator 201 in the previous application, and by controlling the division ratio, the frequencies of the multiphase clock signals output from the output buffer 206 can be adjusted.

However, if an attempt is made to fine-adjust the frequency using a frequency divider circuit, the switching unit is one cycle, and so it is anticipated that jitter may occur during phase comparison. For example, even if the switching unit is kept small in combination with the multiphase output, in order to fine-adjust the frequency an extremely high division ratio would be necessary, leading to a decline in the jitter cutoff characteristic due to the lowered phase comparison frequencies and worsening of PLL responsiveness due to the lowered loop band. Hence the characteristics are inappropriate as the reference frequency of high-precision PWM output.

For these reasons, there has been a need for a function for frequency fine-tuning in pulse-width modulation circuits and multiphase clock generation circuits from which high precision is demanded.

SUMMARY OF THE INVENTION

According to one aspect of the present invention, a pulse width modulation circuit comprises a multiphase clock generation section which generates multiphase clock signals based on a reference clock, and a pulse width modulation signal generation section which generates pulse width modulation signals based on input data and on multiphase clock signals generated by the multiphase clock generation section. The multiphase clock generation section has a phase-locked loop circuit and a clock selection circuit which selects an arbitrary clock signal from among the multiphase clock signals and outputs the selected clock signal to the phase-locked loop circuit as a feedback clock.

According to another aspect of the present invention, a multiphase clock generation circuit comprises a phase comparator, which compares a reference clock and a feedback clock and outputs a phase difference signal according to the comparison result, a multiphase clock generation section, which control an oscillation frequency based on the phase difference signal and generates multiphase clock signals and a clock selection circuit, which performs computation to select the feedback clock from among the multiphase clock signals every fixed period of the reference clock, and switches the feedback clock based on the computation result.

BRIEF DESCRIPTION OF THE DRAWINGS

The above and other objects, advantages and features of the present invention will be more apparent from the following description taken in conjunction with the accompanying drawings, in which:

FIG. 19 is a timing chart explaining the operation of the circuit of FIG. 18.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Embodiment 1 of the Invention

Figure 1:
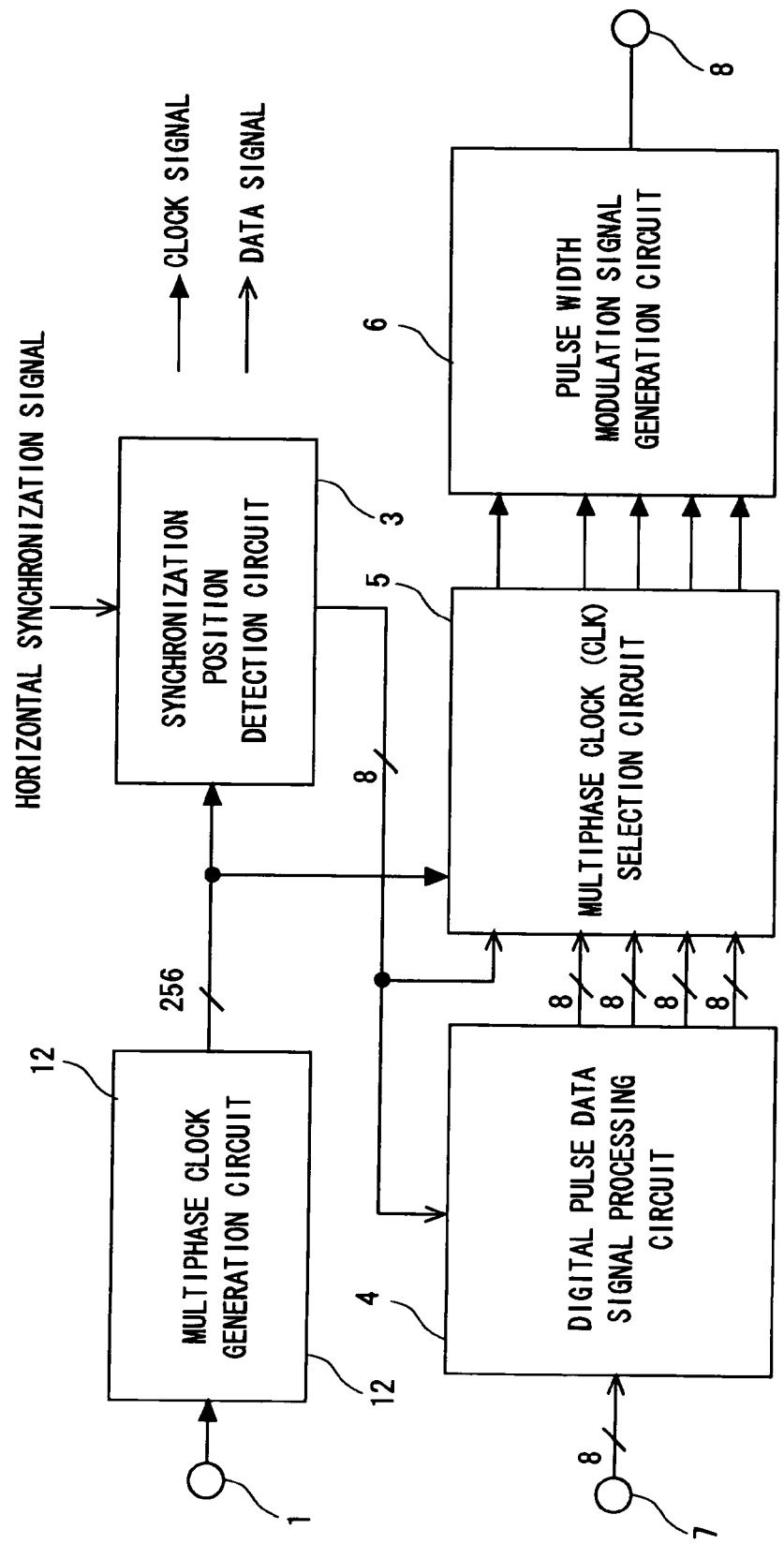
FIG. 1 shows the overall circuit configuration of the pulse width modulation circuit of an embodiment of this invention.
Figure 14:
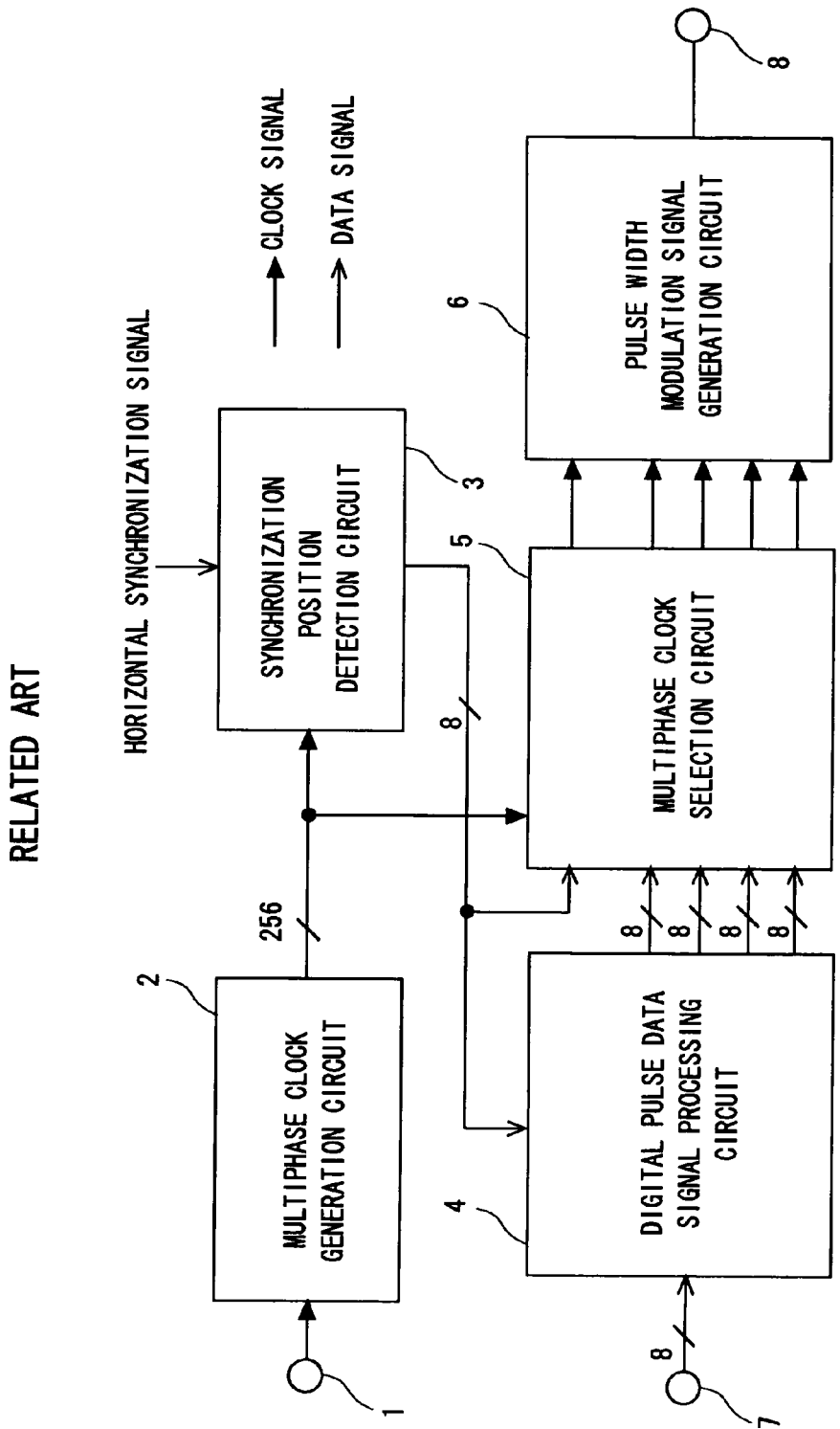
FIG. 14 is a block diagram showing an entire pulse width modulation circuit of the previous application.

A pulse width modulation circuit of this invention is for example used for laser output modulation. FIG. 1 shows the overall circuit configuration of the pulse width modulation circuit of an embodiment of this invention. Other than the multiphase clock generation circuit 12, the configuration of the pulse width modulation circuit is substantially the same as that of the pulse width modulation circuit of the invention of the previous embodiment shown in FIG. 14. Portions which are the same as in the invention of the prior application are assigned the same symbols, and explanations are omitted.

The multiphase clock generation circuit 12 differs from the multiphase clock generation circuit 2 of the invention of the previous application in comprising a frequency fine-adjustment function, described below. However, the multiphase clock generation circuit 12 is similar to the multiphase clock generation circuit 2 of the invention of the previous application in that a reference clock signal is input from the input terminal 1, and in that multiphase clock signals are generated based on the input reference clock and are output to the synchronization position detection circuit 3 and multiphase clock selection circuit 5. Further, the fact that multiphase clock signals are generated by further phase interpolation of intermediate clock signals generated by a phase-locked loop circuit is also similar to the multiphase clock generation circuit 2 of the invention of the previous application.

Figure 2:
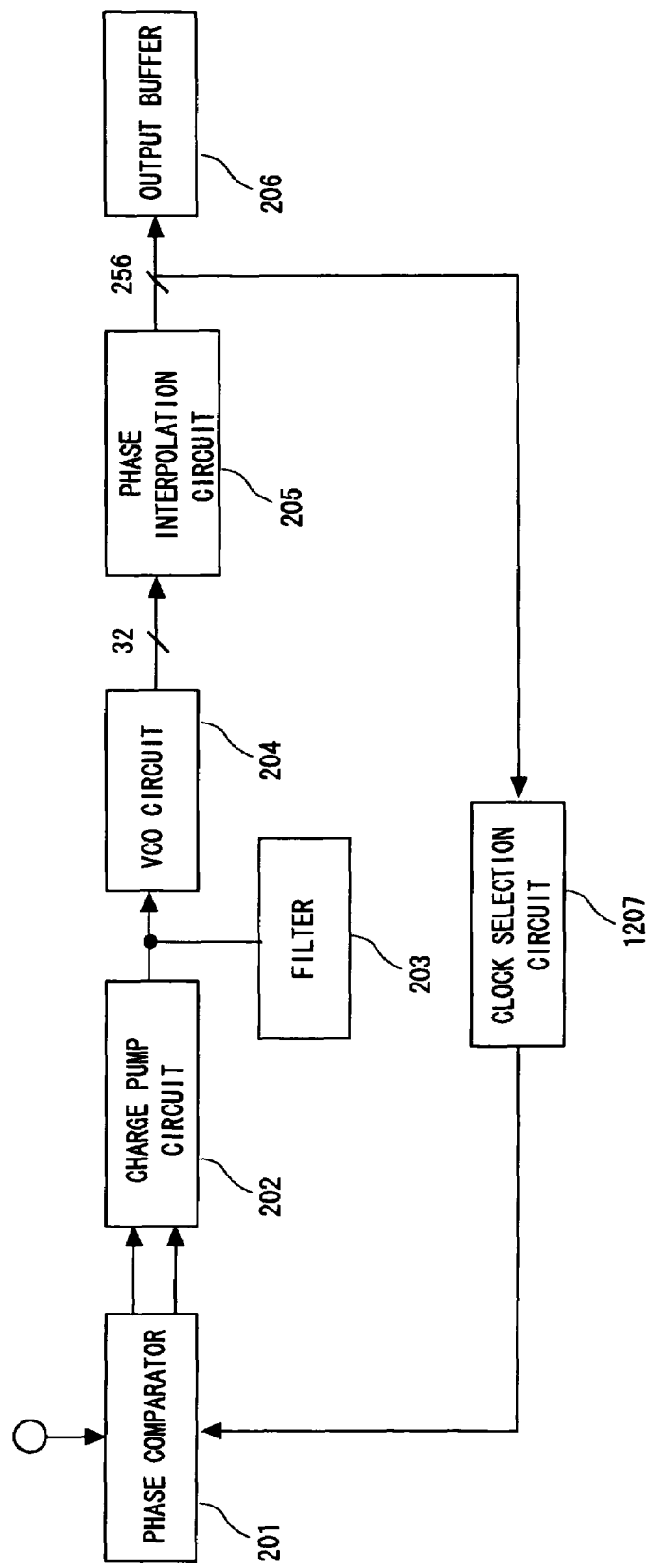
FIG. 2 is a block diagram of the multiphase clock generation circuit of an embodiment.
Figure 15:
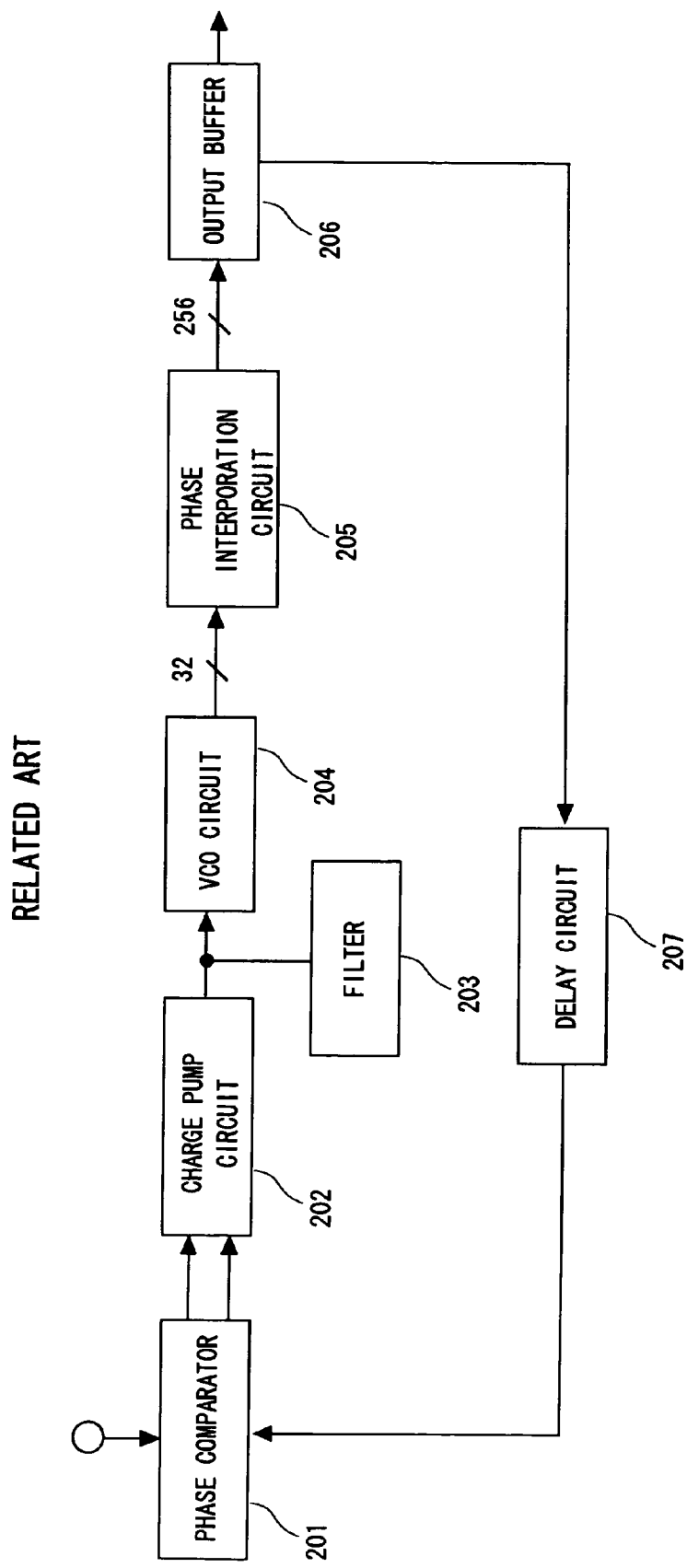
FIG. 15 shows an example of the specific circuit configuration of a multiphase clock generation circuit.

Below, the circuit configuration and operation of the multiphase clock generation circuit 12 are described in further detail. FIG. 2 is a block diagram of the multiphase clock generation circuit of an embodiment. The configuration of this multiphase clock generation circuit is, except for the substitution of the clock selection circuit 1207 for the delay circuit 207, substantially the same as that of the multiphase clock generation circuit disclosed in the previous application and shown in FIG. 15. Portions which are the same as in the previous application are assigned the same symbols, and explanations are omitted. Whereas in the multiphase clock generation circuit of the previous application, of the multiphase clock signals output from the output buffer 206, only the CLKIP[0] signal is always fed back, and is input to the phase comparator 201 via the delay circuit 207, in this embodiment the 256 phases of multiphase clock signals output from the output buffer 206 are input to the clock selection circuit 1207. This embodiment also differs from the previous application in that, of the 256 phases of clock signals input to the clock selection circuit 1207, the one selection clock signal is input to the phase comparator circuit 201.

Figure 3:
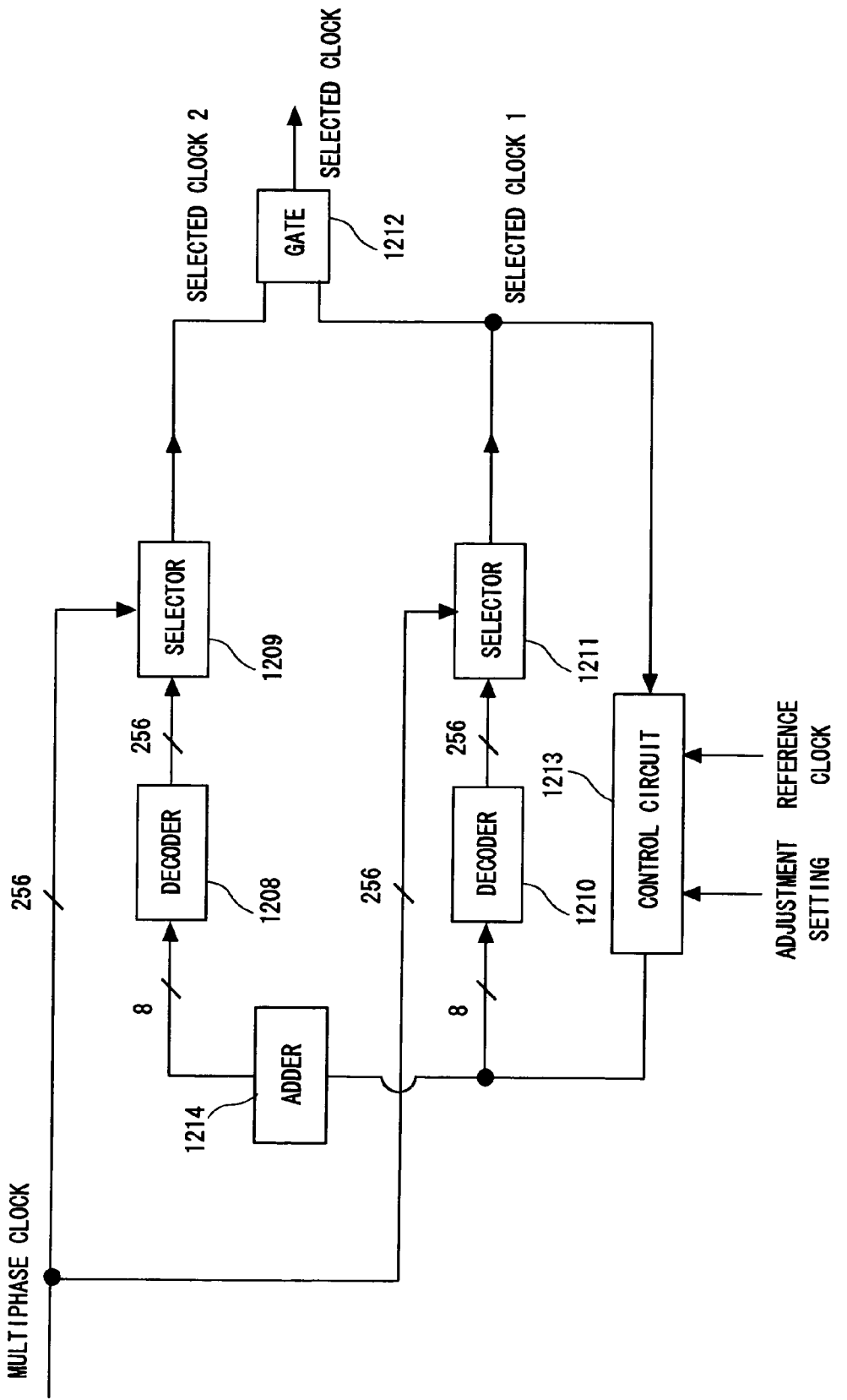
FIG. 3 is a block diagram of the clock selection circuit.

The configuration of the clock selection circuit 1207 is described in greater detail using the block diagram shown in FIG. 3. The clock selection circuit 1207 selects a specified clock phase from among the multiphase clock signals input from the output buffer 206, generates the final clock signal based on the selection clock signal, and outputs the final clock signal to the phase comparator 201. The clock selection circuit 1207 comprises decoders 1208 and 1210, selectors 1209 and 1211, a gate circuit 1212, a control circuit 1213, and an adder 1214. Of these, the control circuit 1213 determines which clock signal phase, among the multiphase clock signals with 256 phases, is to be selected as the selected clock and fed back to the phase comparator 201. The other components which are the decoders 1208 and 1210, selectors 1209 and 1211, gate circuit 1212 and adder 1214, switch the selected clock to the clock with phase determined by the control circuit 1213 such that hazards do not occur during selected clock switching.

Upon each fixed period of the reference clock input from the reference clock input terminal 1, the control circuit 1213 performs computations to determine the next selected clock according to adjustment settings provided from outside, and generates a selection signal. The selection signal is output to the decoder 1210 and adder 1214, synchronized with the falling edge of the selected clock 1.

The decoder 1210 decodes the 8-bit signals input from the control circuit 1213 into 256-bit signals. The selector 1211 selects the clock signal with phase appropriate to the value input from the decoder 1210, among the multiphase clock signals with 256 phases input from the phase interpolation circuit 1205, and outputs this, as the selection clock signal 1, to the gate circuit 1212 and to the control circuit 1213.

The adder 1214 adds a constant value to the selection signal input from the control circuit 1213, and outputs the addition result to the decoder 1208. For example, when the phase is shifted 90°, the value 256×90/360=64 is added.

The decoder 1208 decodes the 8-bit signal input from the adder 1214 into a 256-bit signal. The selector 1209 selects, from among the multiphase clock signals input from the phase interpolation circuit 1205, the clock signal with phase appropriate to the value input from the decoder 1208, and outputs this as the selection clock signal 2 to the gate circuit 1212.

The gate circuit 1212 outputs the final selection clock signal based on the selected clock 1 input from the selector 1211 and the selected clock 2 input from the selector 1209. As the configuration of the gate circuit 1212, the example shown in FIG. 4 is possible.

Figure 4:
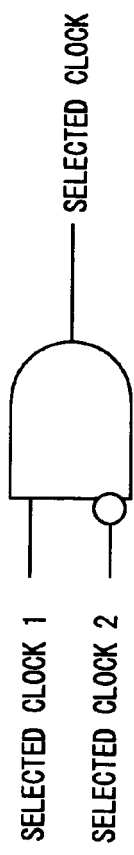
FIG. 4 shows an example of the gate circuit.
Figure 5:
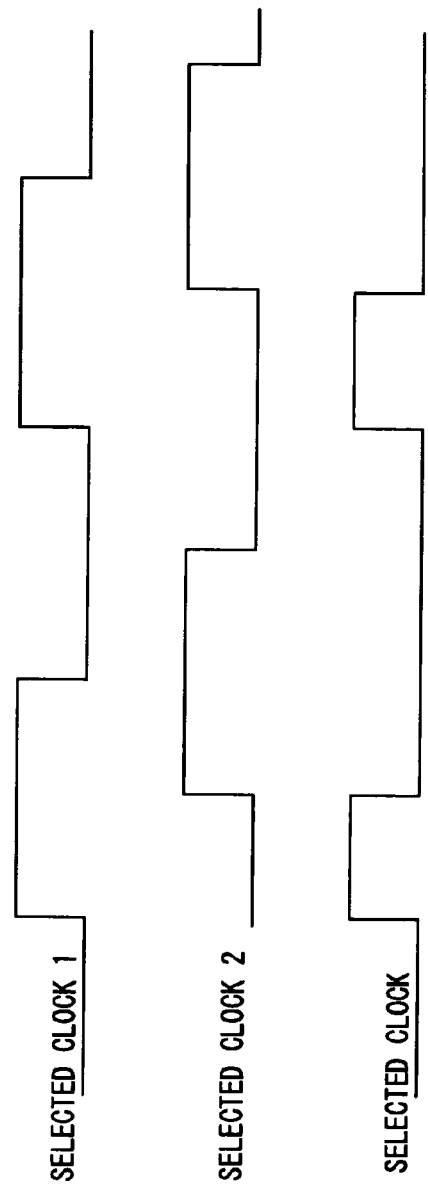
FIG. 5 is a timing chart showing final selected clock.

When the gate circuit 1212 is configured as shown in FIG. 4, the relation between the selected clock 1, selected clock 2, and final selected clock is as shown in the timing chart of FIG. 5. By means of this configuration, fine adjustment of the frequency is possible. The configuration of the gate circuit 1212 is not limited to that of FIG. 4 if similar results are obtained.

Figure 6:
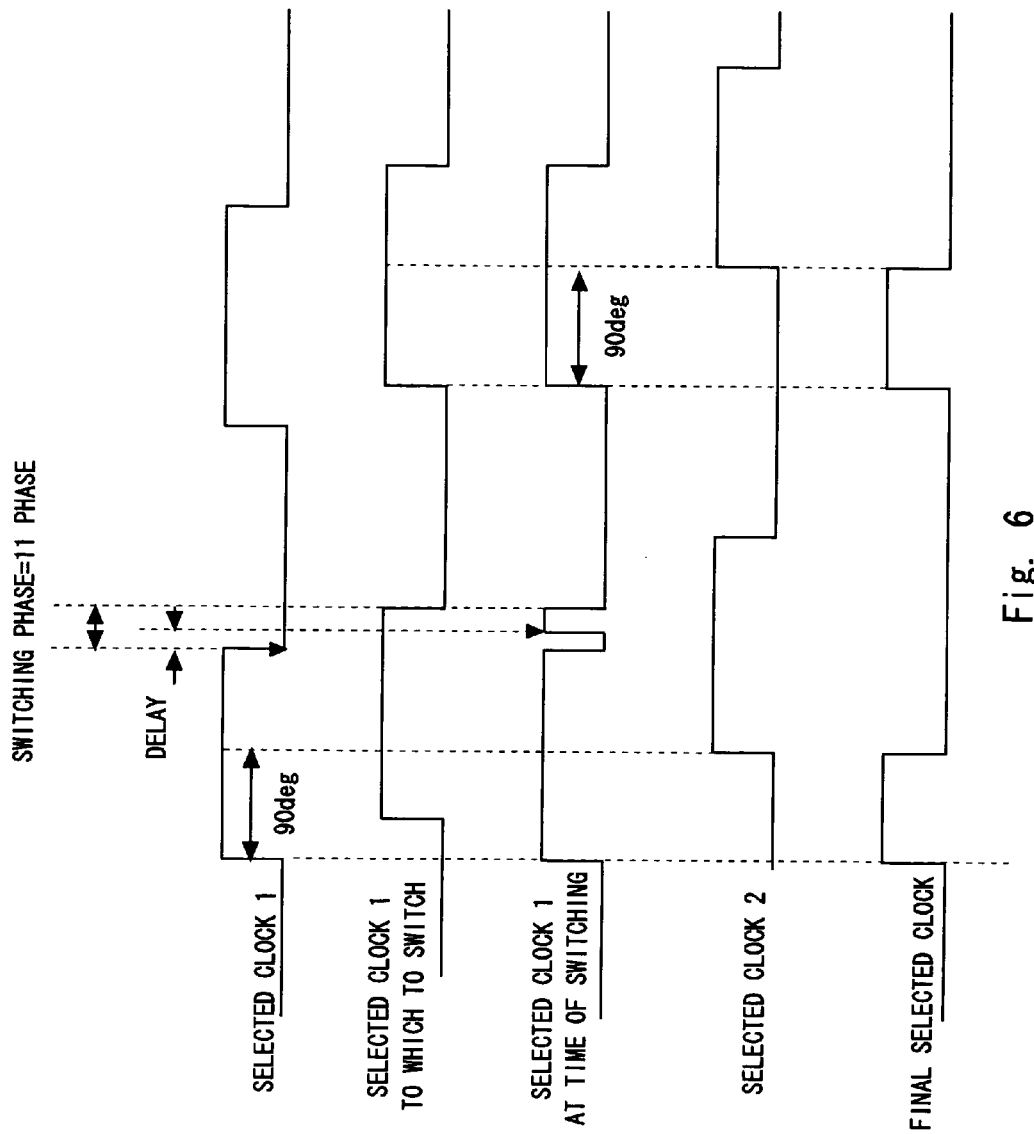
FIG. 6 is a timing chart showing each of the clocks output within the clock selection circuit.

The reason for providing two decoders and two selectors, and for outputting the final selected clock via the gate circuit from two selected clocks, is explained below. FIG. 6 is a timing chart showing each of the clocks output within the clock selection circuit 1207.

In FIG. 6, suppose that the selected clock output from the selector 1211 is switched from "selected clock 1" to "selected clock 1 to which to switch". Switching of the clock is performed by the control circuit 1213 in sync with the falling edge of "selected clock 1", but in actuality the circuit has a delay time, and so a waveform similar to that of "selected clock 1 at time of switching" is output from the selector 1211.

Also, in the instant of switching, the output from the decoder 1210 is unstable. The phase comparator 201 compares the rising waveform of the reference clock with the rising waveform of the feedback clock (selected clock) selected by the clock selection circuit 1207, and so if there is a hazard at the time of this selected clock switching, erroneous operation may occur. Hence it is necessary to mask any hazards which may occur at this time.

To this end, the adder 1214 adds a value to shift the phase of the selection signal output from the control circuit 1213. Here a 90° shift is used, but the phase need not be 90°, so long as masking of such hazards is possible.

The selected clock with the phase shifted 90° is output from the selector 1209 as "selected clock 2". The clock at this time is the selected clock 1 shifted by 90° of FIG. 6.

The gate circuit 1212 combines the selected clock 1 and the selected clock 2, and extracts from selected clock 1 the portion in which hazards do not occur during clock switching, and which has the clock rising edge necessary for phase comparison. The selected clock 1 with the rising portion extracted is output to the phase comparator 201 as the feedback final selected clock (feedback clock). When the selected clock 1 is switched, the selected clock 2 is also switched, after a delay by a delay time computed by the adder 1214. The output from the decoder 1208 at the instant of switching of the selected clock 2 is unstable, but switching is delayed from the switching of selected clock 1 by a delay time computed by the adder 1214, so that the selected clock 1 and the selected clock 2 do not become unstable at the same time, and so hazards are not output from the gate circuit 121. In this way, hazards occurring during switching can be masked.

Figure 7:
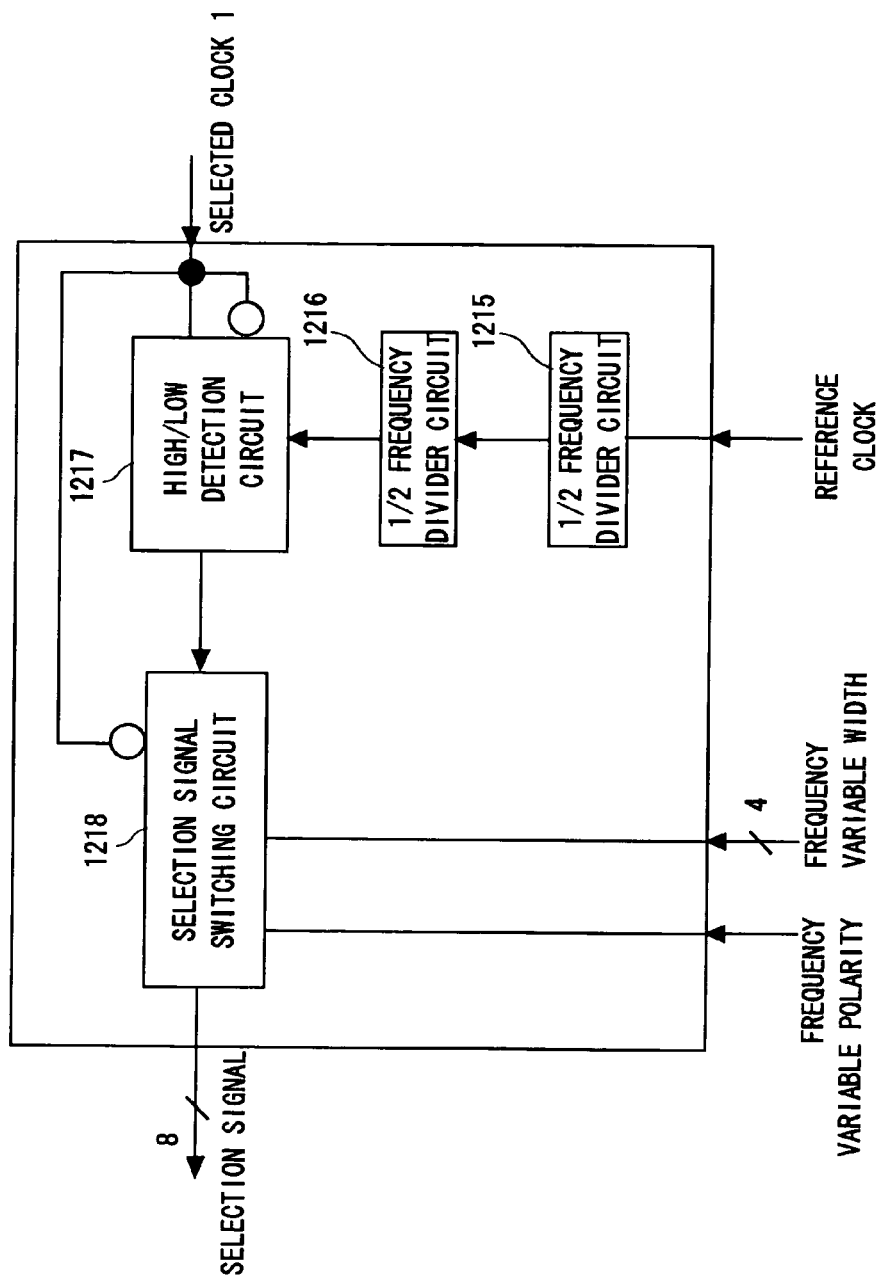
FIG. 7 is a block diagram showing a configuration of the control circuit.

Next, the block diagram of FIG. 7 is used to explain the configuration of the control circuit 1213. The control circuit 1213 comprises ½ frequency divider circuits 1215 and 1216, a high/low detection circuit 1217, and a selection signal switching circuit 1218.

The ½ frequency divider circuits 1215, 1216 generate a clock q1 with frequency ¼ that of the reference clock input from the reference clock input terminal 1. The high/low detection circuit 1217 outputs to the selection signal switching circuit 1218 a clock flag, synchronized with the selected clock 1, once every two periods of the reference clock from the clock q1 and selected clock 1. Each time a flag signal is input, the selection signal switching circuit 1218 adds or subtracts frequency variable width data to or from a base number indicating the current selection signal according to whether the frequency variable polarity data is positive or negative, based on frequency variable polarity data and frequency variable width data input from outside, and determines the next selected clock. Here, the frequency variable width data is 4-bit data. The frequency variable width data and frequency variable polarity data may be set using a microcomputer or similar.

Figure 8:
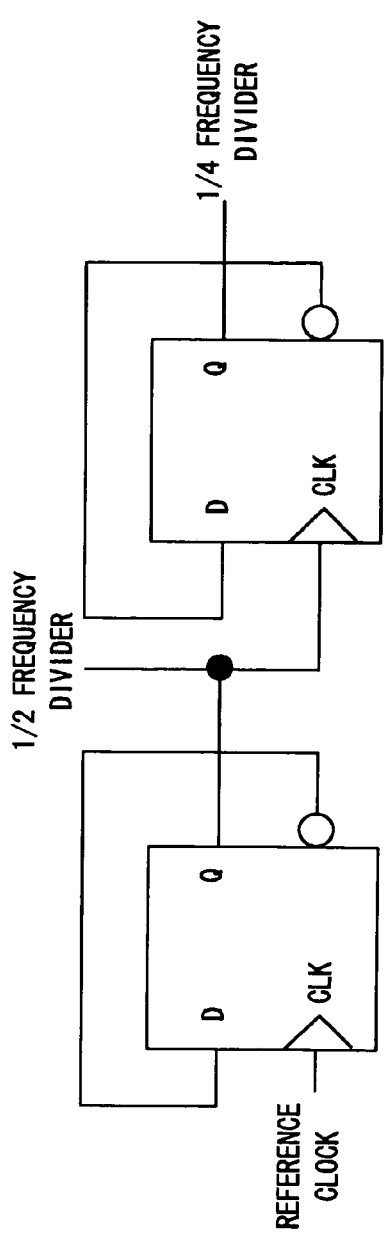
FIG. 8 is a circuit diagram showing a divider circuit.
Figure 9:
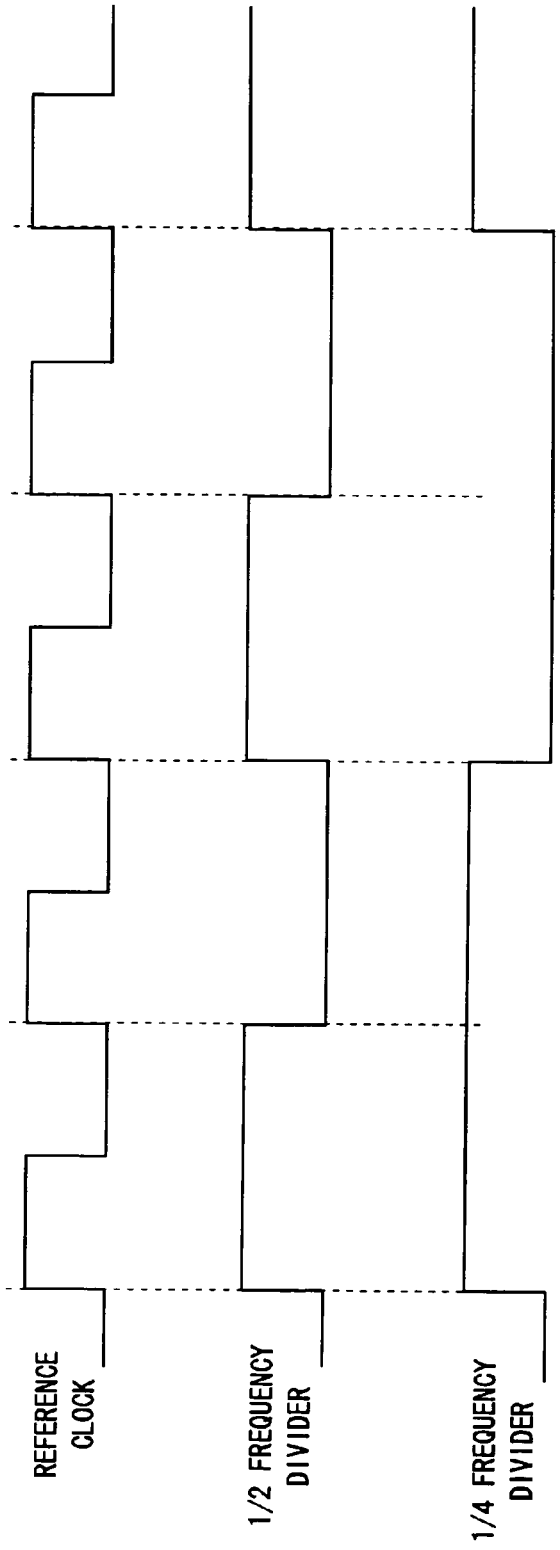
FIG. 9 shows a divides clocks generated by the divider circuit.

The ½ frequency divider circuit 1215 takes as input the reference clock input from the reference clock input terminal 1, and generates a clock frequency-divided to one-half the frequency of the input reference clock. The ½ frequency divider circuit 1216 takes as input the ½-divided reference clock, and further divides this by two. As a result, a clock which is frequency-divided to ¼ the frequency of the reference clock is generated by the ½ frequency divider circuit 1216. The quarter-frequency divided clock generated by the ½ frequency divider circuit 1216 is output to the high/low detection circuit 1217. The configurations of the ½ frequency divider circuits 1215, 1216 re as shown in FIG. 8; the ½- and ¼-frequency divided clocks generated at this time are as shown in FIG. 9.

Figure 10:
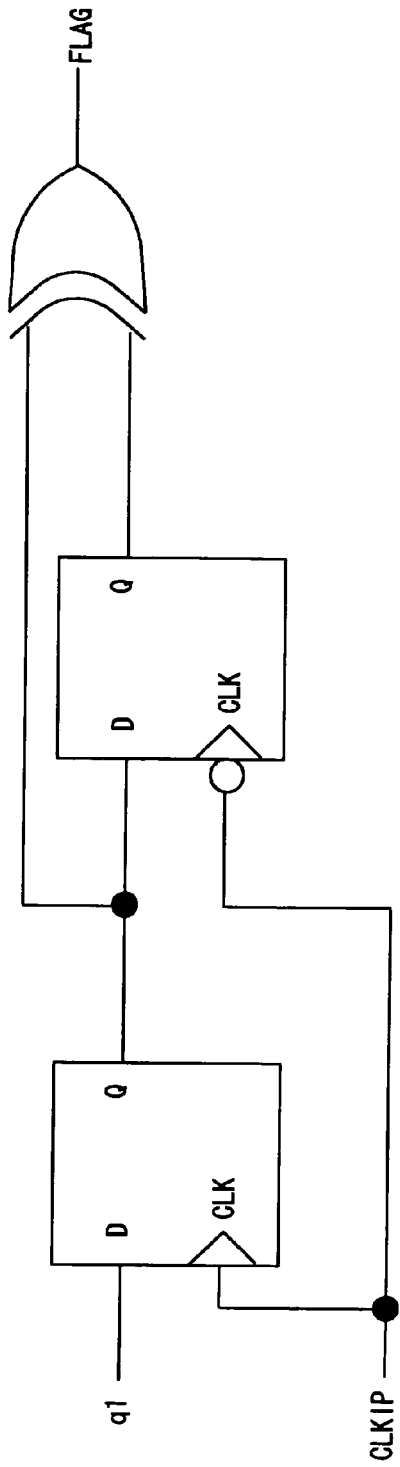
FIG. 10 is a circuit diagram showing a high/low detection circuit.

The high/low detection circuit 1217 takes as inputs the selected clock 1 and the quarter-frequency-divided clock generated by the ½ frequency divider circuits 1215, 1216, and generates a flag signal. The circuit configuration of the high/low detection circuit 1217 is as shown in FIG. 10. The selection signal switching circuit 1218 generates a selection signal based on the input selected clock 1, flag signal, frequency variable polarity, and frequency variable width. The selection signal switching circuit 1217 outputs the generated selection signal to the decoder 1210 and adder 1214.

Figure 11:
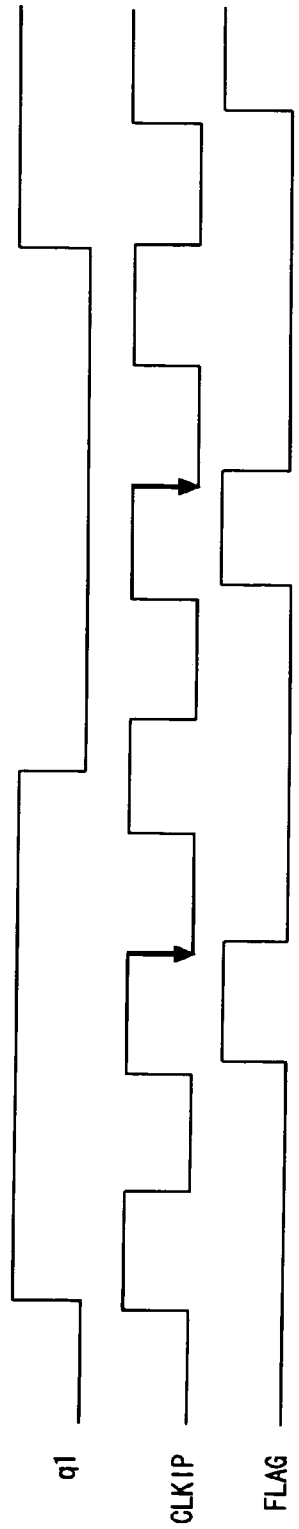
FIG. 11 is a timing chart showing signals input to and output from the high/low detection circuit.

FIG. 11 is a timing chart showing signals input to and output from the high/low detection circuit 1217. In FIG. 11, q1 indicates the input quarter-frequency-divided clock, CLKIP is the input selected clock 1, and flag is the output flag signal. The high/low detection circuit 1217 outputs the flag signal to the selection signal switching circuit 1218.

The selection signal switching circuit 1218 takes as inputs the selected clock 1, flag signal, frequency variable polarity, and frequency variable width. While the input flag signal is Hi, phase switching is performed with the timing of the falling edge of the selected clock 1. At this time, the switching width is determined by the input frequency variable width. Here, the frequency variable width is set to 4 bits, and so switching of up to a maximum 16 phases is possible. Depending on the frequency variable polarity, positive or negative switching can also be set.

Figure 12:
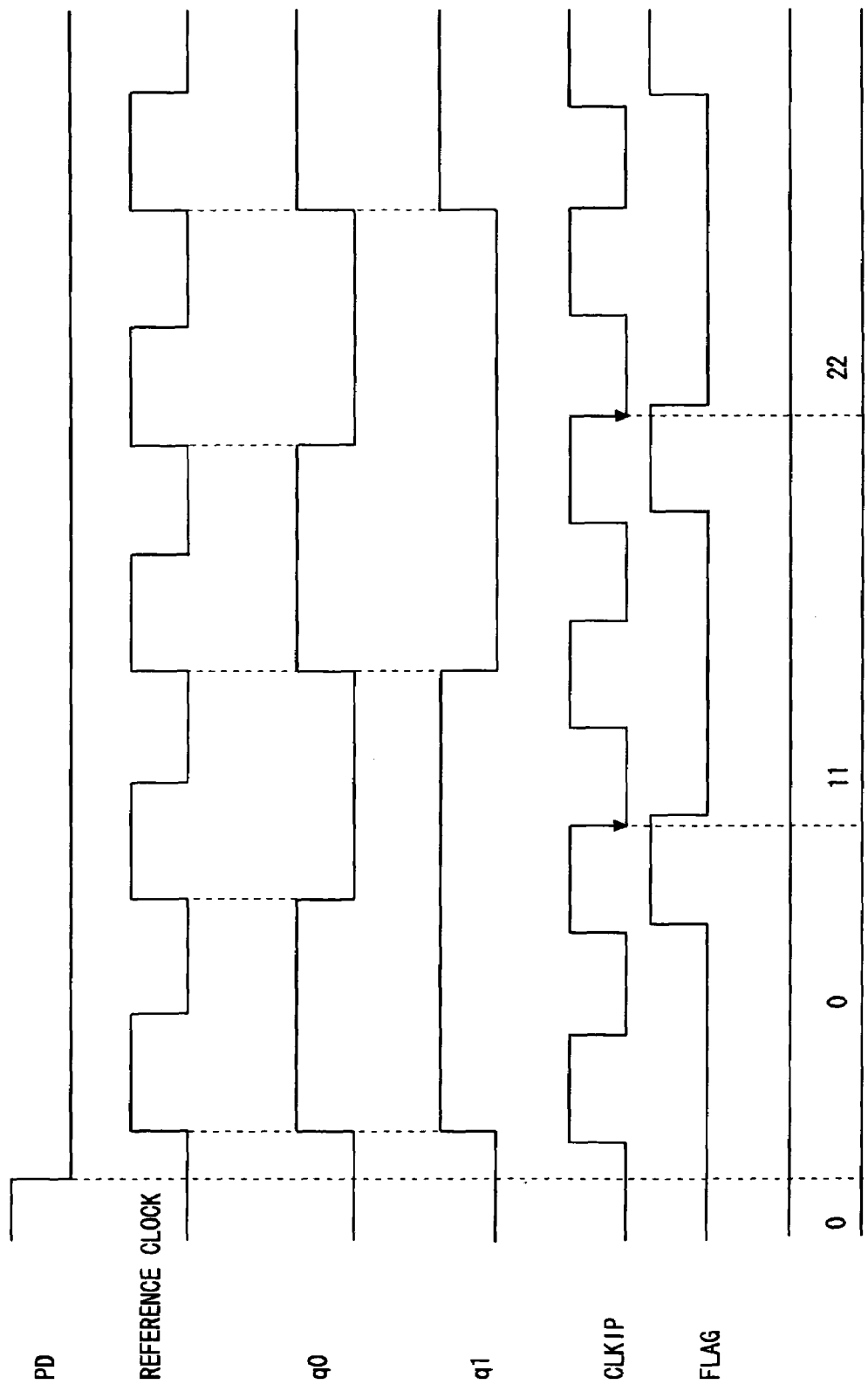
FIG. 12 is a timing chart showing the relation between the signals input to and output from the high/low detection circuit.

FIG. 12 is a timing chart showing the relation between the signals input to and output from the high/low detection circuit 1217, and the selection signals output from the selection signal switching circuit 1218. The numbers at the bottom of FIG. 12 indicate selection signals. When the frequency variable width is 11, while the flag signal is Hi the selection signal phase is switched from 0 to 11, and from 11 to 22 with the timing of the falling edge of the selected clock 1.

Figure 16:
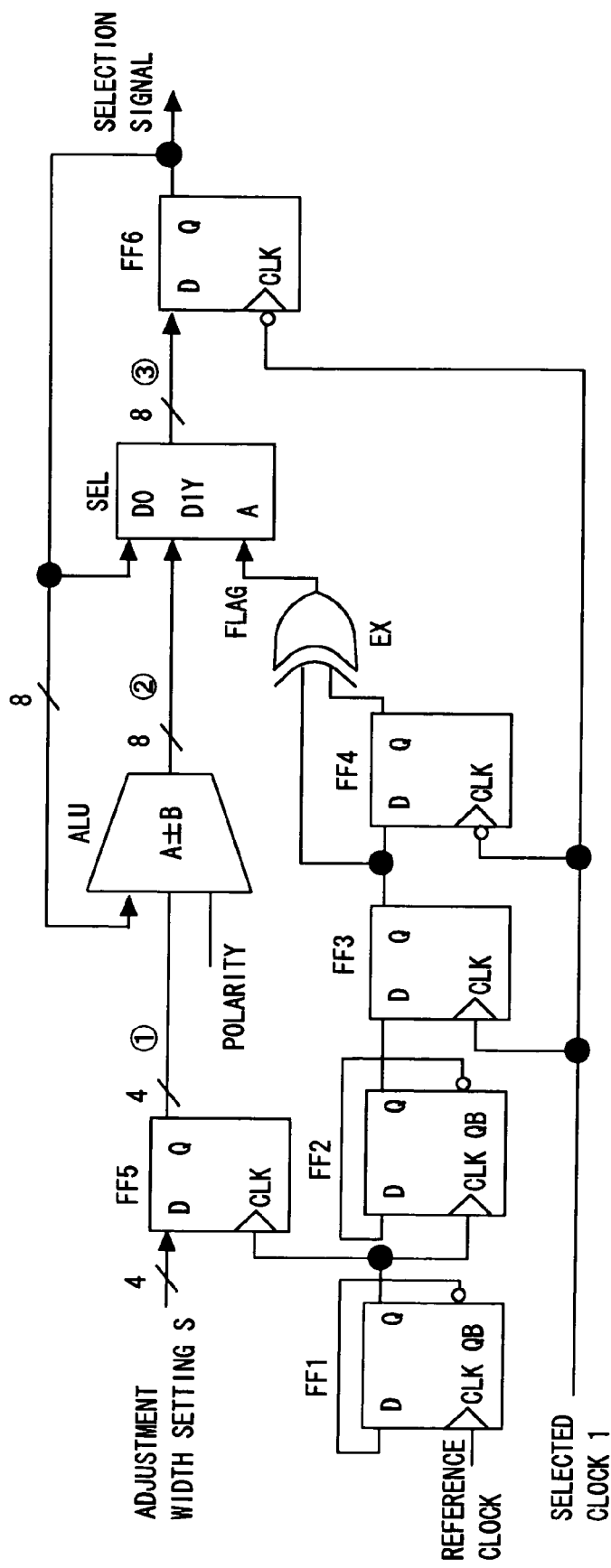
FIG. 16 is a specific circuit diagram of a control circuit 1213.

Next, the circuit configuration of the control circuit 1213 is explained in further detail. FIG. 16 is a specific circuit diagram of a control circuit 1213. Here, the flip-flops FF1, FF2 correspond to the ½ frequency divider circuits 1215, 1216 respectively in FIG. 7; the flip-flops FF3, FF4 and exclusive OR gate EX correspond to the high/low detection circuit 1217; and the flip-flop FF5, adder/subtracter ALU, selector SEL, and flip-flop FF6 correspond to the selection signal switching circuit 1218. Here, the number of the currently selected clock signal is stored in FF6, and each time a flag signal is input the value stored in this FF6 is added to or subtracted from the frequency variable width setting data S by the ALU according to whether the "frequency variable polarity" is positive or negative, and the computation result is again stored in FF6. When the flag signal is at high level, the selector SEL outputs the D1 input, and when the flag signal is at low level, the selector SEL outputs the D0 input to FF6.

Figure 17:
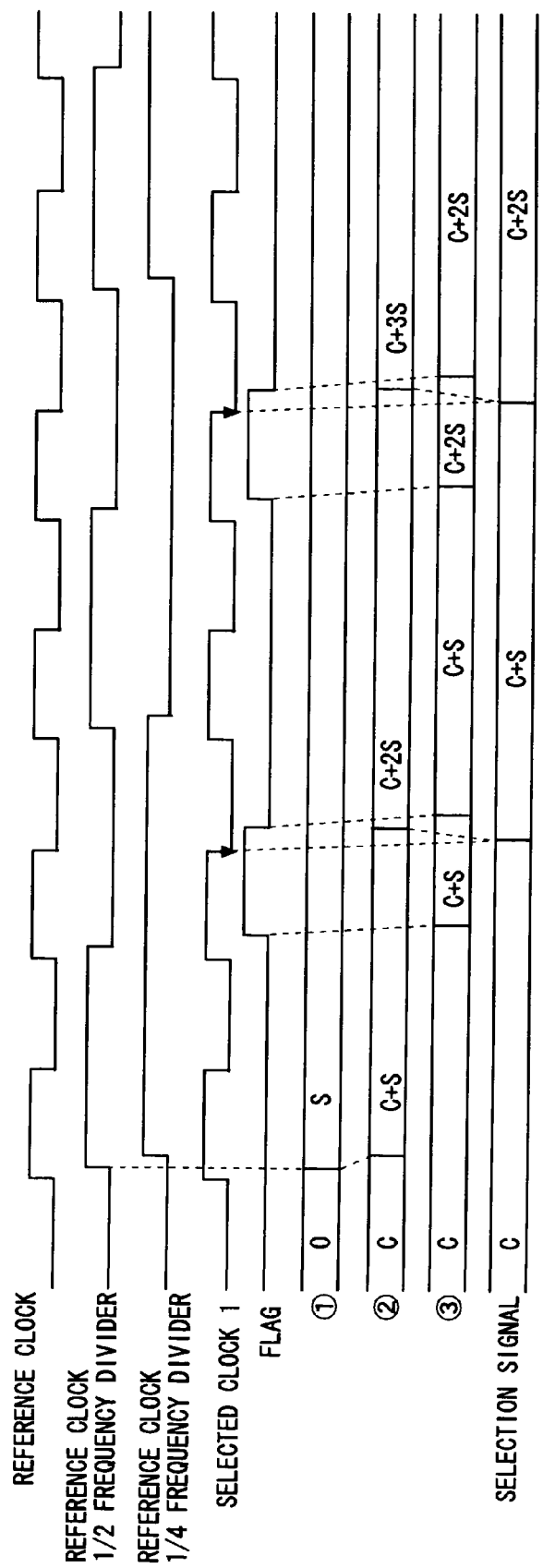
FIG. 17 is a timing chart explaining the operation of the circuit of FIG. 16.

Next, operation of the circuit of FIG. 16 is explained using the timing chart of FIG. 17. Suppose that initially the current clock selection number C (8-bit data) is stored in the FF6. The frequency variable width setting data S (4 bits), set from outside, is latched by the FF5 on the riding edge of the FF1 output of the initial reference clock ½-frequency-divided signal. The ALU then adds or subtracts the frequency variable width setting data S to or from the clock selection number C according to whether the frequency variable polarity data is positive or negative (0 or 1). Here, if the frequency variable polarity data is positive and so of value "0", the value of C+S is output from the ALU. Next, when the flag signal goes to high level, the selector SEL outputs this C+S to the FF6. The FF6 latches this value at the falling edge of selected clock 1, and the clock selection number is updated from C to C+S. Similarly thereafter, when the flag is at high level, at each falling edge of the selected clock 1 the selection clock number is incremented by S. The ALU performs addition and subtraction while ignoring overflow and underflow, and so the remainder resulting from division of the addition/subtraction result by 256 is stored as the selection clock number in the FF6.

By means of this configuration, the pulse width modulation circuit of this invention is capable of modification of frequencies by means a multiphase clock generation circuit, so that fine adjustment of frequencies is possible.

Embodiment 2 of the Invention

Figure 13:
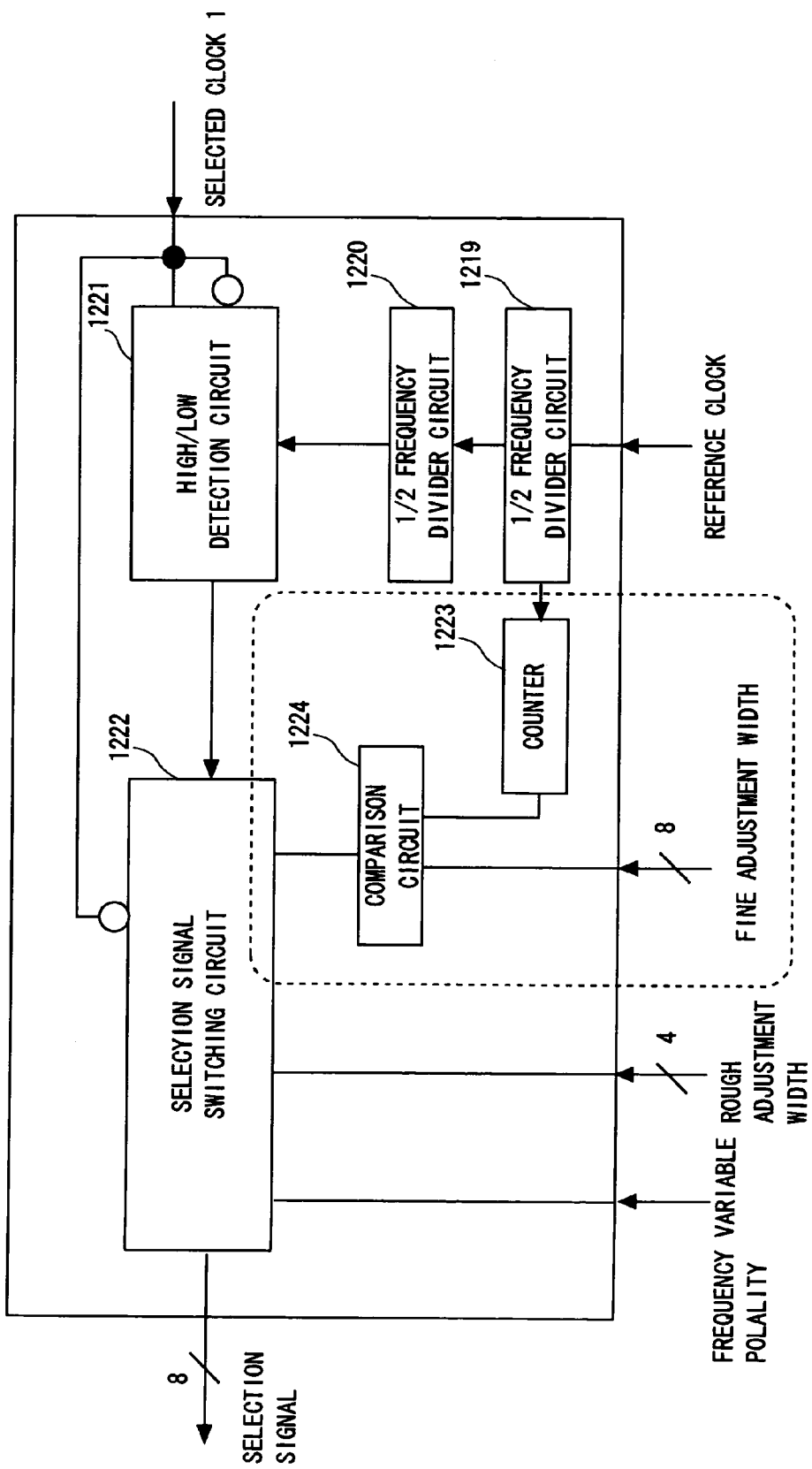
FIG. 13 is a block diagram showing the control circuit.

In the above-described example, the control circuit had two switching cycles, and the frequency variable width setting was 4 bit; but a configuration such as that shown in FIG. 13 may be used. In the configuration of FIG. 13, a combination of two switching cycles, and frequency variable widths of 4 and 8 bits is used.

The control circuit shown in FIG. 13 comprises ½ frequency divider circuits 1219, 1220, a high/low detection circuit 1221, a selection signal switching circuit 1222, a counter 1223, and a comparison circuit 1224. Processing of the ½ frequency divider circuits 1219, 1220 and of the high/low detection circuit 1221 is similar to that of Embodiment 1 of the invention, and explanations are here omitted.

The counter 1223 performs counting according to input of clock signals from the ½ frequency divider circuit 1219. The counter 1223 outputs the count value to the comparison circuit 1224.

The comparison circuit 1224 compares the value input from the counter 1223 and a fine adjustment width set in advance, and according to the result of comparison of magnitudes, executes control to increase by one, or to decrease by one, the coarse adjustment width of the selection signal switching circuit 1222.

The selection signal switching circuit 1222 outputs a selection signal according to the frequency variable polarity and coarse adjustment width. The coarse adjustment width in FIG. 13 differs from the frequency variable width of Embodiment 1 of this invention in that the value is incremented or decremented by one according to the result of comparison by the comparison circuit 1224.

Figure 18:
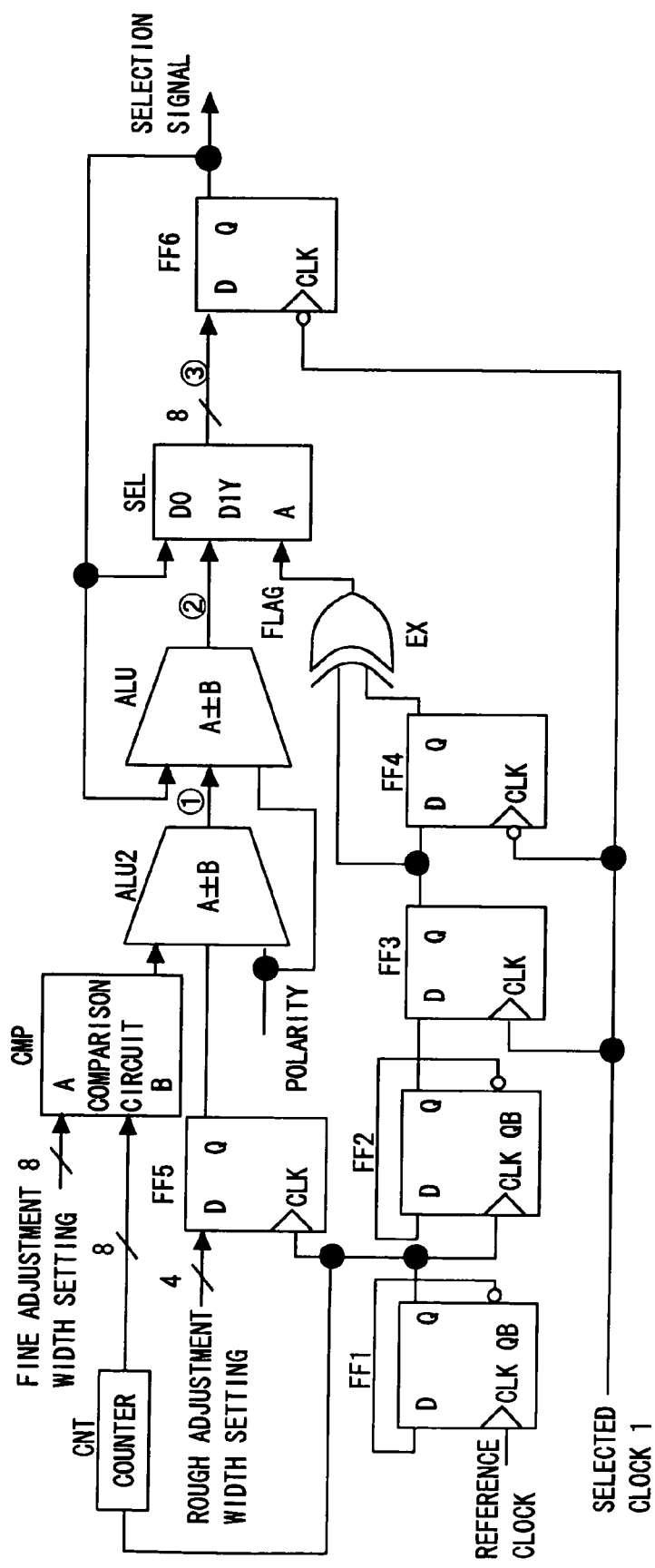
FIG. 18 is a specific circuit diagram of a control circuit.

Next, the detailed configuration and operation of the control circuit of this embodiment are explained using the circuit diagram of FIG. 18 and timing chart of FIG. 19. In order to avoid redundancy in the explanation, explanations of circuits which are the same as in Embodiment 1 are omitted. FIG. 18 further comprises, in addition to the configuration of FIG. 16, an 8-bit counter CNT (1223 in FIG. 13), a comparison circuit CMP (1224 in FIG. 13), and a supplemental adder/subtracter ALU2, which adds or subtracts the 4-bit coarse adjustment width setting value either 1 or 0, according to the CMP comparison result.

The counter CNT is an 8-bit counter which counts up one each time the selection signal is switched. Specifically, the signal at ½ the frequency of the reference clock is counted. In the event of an overflow, the counter CNT returns to zero and continues counting.

The comparison circuit CMP compares the 8-bit fine adjustment width setting and the counter count value, and outputs 1 when the fine adjustment width setting A>counter count value B, but outputs 0 when the fine adjustment width setting A≦counter count value B.

The supplemental adder/subtracter ALU2 uses the frequency variable polarity data to add and subtract the coarse adjustment width setting output by FF5 and the output of the comparison circuit CMP. As a result, when the count value of the counter CNT is smaller than the fine adjustment width setting, each time a flag signal is input the selection signal is updated by adding the fine adjustment width setting S+1 or by subtracting S−1, and when the count value of the counter CNT is equal to or larger than the fine adjustment width setting, adds or subtracts S only to update the selection signal.

By this means, while using coarse adjustment to maintain the frequency within a broad adjustment range, fine adjustment can be used to make finer adjustments to the frequency. The 8-bit fine adjustment width setting provided to the comparison circuit CMP from outside can also be set by a microcomputer or similar.

Other Embodiments of the Invention

In the above-described example, multiphase clocks were generated by the multiphase clock generation circuit using a phase interpolation circuit; however, multiphase clocks may be generated by means other than interpolation. Further, in the above-described Embodiments, examples in which the selected clock is updated upon every two periods of the reference clock were given; but by changing the division ratio of the circuit which divides the frequency of the reference clock for input to the high/low detection circuits 1217 and 1221 and counter 1223, a configuration can be adopted in which the selected clock is updated at an arbitrary number of periods of the reference clock. Further, this frequency division circuit itself may be a programmable frequency division circuit, which can be set by a microcomputer or similar, similarly to the frequency variable width data and frequency variable polarity. Also, a multiphase clock generation circuit of this invention need only output to the outside clocks with the number of phases necessary; if only a single phase is necessary, only a clock with a single phase may be output.

It is apparent that the present invention is not limited to the above embodiment and it may be modified and changed without departing from the scope and spirit of the invention.

What is claimed is:

1. A pulse width modulation circuit, comprising:
   a multiphase clock generation section which generates multiphase clock signals based on a reference clock; and
   a pulse width modulation signal generation section which generates pulse width modulation signals based on input data and on multiphase clock signals generated by the multiphase clock generation section,
   wherein the multiphase clock generation section includes a phase-locked loop circuit and a clock selection circuit which selects an arbitrary clock signal from among the multiphase clock signals and outputs the selected clock signal to the phase-locked loop circuit as a feedback clock.

2. The pulse width modulation circuit according to claim 1, wherein a phase interpolation circuit is provided in the multiphase clock generation section in a stage after a voltage-controlled oscillator included in the phase-locked loop circuit, and output signals from the phase interpolation circuit are output as multiphase clock signals.

3. The pulse width modulation circuit according to claim 1, wherein the clock selection circuit includes a first selector which selects an arbitrary clock signal from among the multiphase clock signals generated by the multiphase clock generation section, a second selector which selects a clock signal different in phase from the clock signal selected by the first selector, and a gate circuit which outputs the final selected clock based on the clock signal selected by the first selector and the clock signal selected by the second selector.

4. The pulse width modulation circuit according to claim 3, wherein the second selector includes a shifting section which shifts the clock signal selected by the first selector.

5. The pulse width modulation circuit according to claim 3, wherein the clock selection circuit includes a control circuit which sets the clock signals selected by the first selector and by the second selector.

6. The pulse width modulation circuit according to claim 1, wherein the pulse width modulation signals comprise signals used to modulate laser output.

7. The pulse width modulation circuit according to claim 1, wherein the clock selection circuit comprises a computation circuit which performs computation to determine the feedback clock every fixed period of the reference clock.

8. The pulse width modulation circuit according to claim 7, wherein the clock selection circuit further comprises a register which holds the computation results, and the computation to determine the feedback clock comprises a computation to determine the clock to select by addition or subtraction of a prescribed value to or from a value held in the register.

9. The pulse width modulation circuit according to claim 7, wherein the clock selection circuit comprises:
    a register holding the computation result;
    an oscillation frequency general adjustment circuit periodically adding or subtracting a general frequency adjustment value to or from the computation result, and renewing the computation result; and
    an oscillation frequency fine adjustment circuit periodically adding or subtracting a fine frequency adjustment value to or from the computation result within a fine adjustment period.

10. The pulse width modulation circuit according to claim 9, wherein the oscillation frequency fine adjustment circuit comprises:
    a counter counting the reference clock; and
    a comparison circuit comparing a count value of the counter with a predetermined fine adjustment period setting value,
    wherein the fine adjustment period is determined by comparing a result of the comparison circuit.

11. A multiphase clock generation circuit, comprising:
    a phase comparator, which compares a reference clock and a feedback clock and outputs a phase difference signal according to the comparison result;
    a multiphase clock generation section, which controls an oscillation frequency based on the phase difference signal and generates multiphase clock signals; and,
    a clock selection circuit, which performs computation to select the feedback clock from among the multiphase clock signals every fixed period of the reference clock, and switches the feedback clock based on the computation result.

12. The multiphase clock generation circuit according to claim 11, wherein the clock selection circuit comprises a selected clock number holding register which holds the computation result, and a computation circuit which, for each fixed period of the reference clock, adds or subtracts a frequency variable width setting value, set in advance, to or from a value held in the register.

13. The multiphase clock generation circuit according to claim 11, wherein the clock selection circuit comprises a clock switching circuit which switches, among rising and falling edges of the feedback clock, the feedback clock at the edge on which comparison with the reference clock by the phase comparator is not performed.

14. The multiphase clock generation circuit according to claim 11, wherein the clock selection circuit comprises:
    a register holding the computation result;
    an oscillation frequency general adjustment circuit periodically adding or subtracting a general frequency adjustment value to or from the computation result, and renewing the computation result; and
    an oscillation frequency fine adjustment circuit periodically adding or subtracting a fine frequency adjustment value to or from the computation result within a fine adjustment period.

15. The multiphase clock generation circuit according to claim 14, wherein the oscillation frequency fine adjustment circuit comprises:
    a counter counting the reference clock; and
    a comparison circuit comparing a count value of the counter with a predetermined fine adjustment period setting value,
    wherein the fine adjustment period is determined by comparing result of the comparison circuit.

16. The multiphase clock generation circuit according to claim 11, wherein the clock selection circuit comprises a general adjusting means for generally adjusting the oscillation frequency and a fine adjusting means for precisely adjusting the oscillation frequency.

17. The multiphase clock generation circuit according to claim 16, wherein the general adjusting means adds or subtracts a general frequency adjustment value to or from the computation result and renews the computation result, and
    wherein the fine adjusting means further adds or subtracts a fine adjustment value thereto or therefrom within a fine adjustment period.

* * * * *